United States Patent [19]
Hotta

[11] Patent Number: 5,748,561
[45] Date of Patent: May 5, 1998

[54] SEMICONDUCTOR MEMORY DEVICE WITH FAST SUCCESSIVE READ OPERATION

[75] Inventor: Yasuhiro Hotta, Nara, Japan

[73] Assignee: Sharp Kabushiki Kaisha, Osaka, Japan

[21] Appl. No.: 742,338

[22] Filed: Nov. 1, 1996

Related U.S. Application Data

[62] Division of Ser. No. 459,792, Jun. 2, 1995, Pat. No. 5,619,473.

Foreign Application Priority Data

Aug. 23, 1994 [JP] Japan .................. 6-198498

[51] Int. Cl.⁶ .................................................. G11C 8/00
[52] U.S. Cl. ............................. 365/238.5; 365/189.02
[58] Field of Search .......................... 365/238.5, 220, 365/189.02, 221, 189.05

[56] References Cited

U.S. PATENT DOCUMENTS

| | | | |
|---|---|---|---|
| 5,245,585 | 9/1993 | Voss | 365/238.5 |
| 5,257,235 | 10/1993 | Miyamoto | 365/230.03 |
| 5,293,332 | 3/1994 | Shirai | 365/189.02 |
| 5,305,284 | 4/1994 | Iwase | 365/238.5 |
| 5,357,477 | 10/1994 | Matsumoto | 365/238.5 |
| 5,398,213 | 3/1995 | Yeon et al. | 365/238.5 |

FOREIGN PATENT DOCUMENTS

| | | | |
|---|---|---|---|
| 00639835 | 2/1995 | European Pat. Off. | 365/238.5 |
| 5-144255 | 6/1993 | Japan . | |

*Primary Examiner*—David C. Nelms
*Assistant Examiner*—Son Mai
*Attorney, Agent, or Firm*—Morrison & Foerster LLP

[57] ABSTRACT

A semiconductor memory device of the invention includes a memory cell array having a plurality of memory cells, row selector for selecting a row of the memory cell array corresponding to a row address of an input address, and column selector for selecting a plurality of columns of a memory cell array corresponding to a column address of an input address, and also selecting a plurality of columns of a memory cell array corresponding to at least one column address other than a column address of an input address. The device also includes a sense amplifier for sensing data stored in memory cells. The sense amplifier has at least two sense amplifier groups, the sense amplifier groups sensing data read from a plurality of memory cells corresponding to an input address, and data read from a plurality of memory cells corresponding to the row address of an input address and at least one other column address. The device has a page mode for rapidly switching and outputting data from a plurality of memory cells which have been read in parallel to sense amplifier in accordance with an input address.

6 Claims, 12 Drawing Sheets

SEMICONDUCTOR MEMORY DEVICE WITH FAST SUCCESSIVE READ OPERATION

This application is a Divisional of application Ser. No. 08/459,792 filed Jun. 2, 1995, U.S. Pat. No. 5,619,473.

BACKGROUND OF THE INVENTION

1. Field of the Invention

The present invention relates to a semiconductor memory device, and more particularly to a page-mode read circuit used in a semiconductor memory device having a page mode.

2. Description of the Related Art

Recently, as the operation speed of microprocessors and the like is increased, semiconductor memory devices are increasingly required to operate at higher speeds. Accordingly, there has been developed a semiconductor memory device having a normal mode in which the random access is rapidly performed, and also having a page mode in which the access method is somewhat limited, but the read operation can be performed at a higher speed.

The read operation in the page mode is described. A plurality of memory cells in a memory cell array are simultaneously selected in accordance with a column address and a row address of an input address, and a plurality of data units are read and fed up to a sense amplifier as page data. In such a state, a page-mode address is changed, so that the data units stored in the selected plurality of memory cells are rapidly switched and sequentially output.

FIG. 8 is a block diagram which illustrates a general configuration for performing a page-mode operation in a conventional mask read-only memory (ROM). FIG. 9 is a diagram showing a specific circuit configuration of components which contribute to the page-mode operation of the mask ROM. FIG. 10 is a timing chart illustrating an exemplary read operation in the page mode.

Herein, address signals A0 to A2 among address signals A0 to A19 indicate a page-mode address. The address signals A3 to A6 indicate a column address, and the address signals A7 to A19 indicate a row address.

As shown in FIG. 8, a conventional mask ROM 200 having a page mode includes a memory cell array 10 in which memory cells are arranged in a matrix. The mask ROM 200 further includes a row selection section for selecting memory cells arranged in a row corresponding to the row address indicated by the address signals A7 to A19. The row selection section includes an input buffer 11 for receiving the address signals A7 to A19, a predecoder A 12 connected to the output of the input buffer 11, and an X decoder 13 for selecting a row of the memory cell array 10 in accordance with the output of the predecoder A 12.

The mask ROM 200 also includes a column selection section for selecting a plurality of columns of memory cells corresponding to the column address indicated by the address signals A3 to A6 of the column address. The column selection section includes an input buffer 21 for receiving the address signals A3 to A6, a predecoder B 22 connected to the input buffer 21, and a Y decoder/selector 23 for selecting a plurality of columns of memory cells of the memory cell array 10 in accordance with the outputs CA0 to CA3 and CB0 to CB3 of the predecoder B 22. The Y decoder/selector 23 includes a Y selector 23b for selecting each column of the memory cell array 10, and a Y decoder 23a for allowing the Y selector 23b to simultaneously select predetermined columns, as shown in FIG. 9.

The Y decoder/selector 23 is connected to a sense amplifier group 24 including a plurality of sense amplifiers for sensing respective information stored in the memory cells. The output of the sense amplifier group 24 is connected to a selector 33 for selecting the output from the respective amplifiers in accordance with sense amplifier selection signals P0 to P7 based on the address signals A0 to A2 of the page-mode address.

The selector 33 is connected to a page-mode decoder 32 which outputs the sense amplifier selection signals P0 to P7. The input of the page-mode decoder 32 is connected to an input buffer 31 which receives the address signals A0 to A2 of the page-mode address. An output circuit 20 outputs the output of the selector 33 to an output terminal 2.

Next, the operation is described with reference to FIGS. 9 and 10.

At time t0, the input of the address signals A0 to A19 is made valid. In this case, the mask ROM is set in a normal random access mode.

First, the address signals A7 to A19 of the column address are decoded by the input buffer 11, the predecoder A 12, and the X decoder 13, so that any one of word lines WLi is made active. Herein, the level of the active word line is "High."

At this time, based on the address signals A3 to A6 of the column address, one of the output signals CA0 to CA3 and one of the output signals CB0 to CB3 of the predecoder B 22 are made active (i.e., set in the "High" level).

For example, when the address signals A3 to A19 specify the address a, the output signals CA0 and CB0 are made active. Accordingly, only output signal CS0 among output signals CS0 to CS15 of the Y decoder 23a is made active (i.e., "High"), so that a column selection MOS transistor 3 of the Y selector 23b, which receives the output signal CS0 from the Y decoder 23a as its input, is turned "ON." In this way, memory cells $M0_{i0}, \ldots, M0_{i7}$ are selected. The respective information of the selected memory cells is transmitted to common bit lines CBIT0 to CBIT7 via the column selection MOS transistors 3, and then input into the sense amplifier group 24. At time t1, the outputs SA0 to SA7 of the sense amplifiers are made valid, so that the data read of the page at the address a specified by the address signals A3 to A19 is completed.

In accordance with the address signals A0 to A2 of the page-mode address, only one of the output signals P0 to P7 of the page-mode decoder 32 is made active (i.e., set in the "High" level), so that one of the sense amplifier outputs SA0 to SA7 is selected by the selector 33. The selected sense amplifier output is output to the output terminal 2 through the output circuit 20 at time t2.

Thereafter, at time t3, the change of the address signals A0 to A2 of the page-mode address is started, the selector 33 sequentially selects the data of the sense amplifier outputs SA0 to SA7, and the selected data is output to the output terminal 2 through the output circuit 20. The response at the output terminal 2 to the start of the change of the address signals A0 to A2 appears at time t4. As described above, the device is set in the page mode in which the high-speed read can be performed from the start of the change of the address signals A0 to A2. The time period for reading is (t4—t3).

For example, when the address signals A3 to A19 specify an address (a+1) corresponding to the next page at time t6, the predecode output signal CA0 is made inactive (i.e., "Low"), and the predecode output signal CA1 is made active (i.e., "High"). Accordingly, the Y-decode output CS0 is made inactive (i.e., "Low"), and the Y-decode output CS1 is made active (i.e., "High"), so that the memory cell M1$_{i0}$, ..., M1$_{i7}$ are selected. The respective information of the memory cells is transmitted to the common bit lines CBIT0 to CBIT7 via the column selection MOS transistors 3, and then input into the sense amplifier group 24. As described above, when the page data is changed, the read of the information from memory cells is performed in the normal random access mode, and the high-speed read cannot be performed.

As disclosed in Japanese Laid-Open Patent Publication No. 5-144255, there has been already developed a semiconductor memory device having a page mode in which the high-speed read can be performed when the page data is changed in order to successively read the page data. FIG. 11 is a block diagram showing a configuration of a semiconductor memory device described in the above-identified publication. FIG. 12 is a timing chart for illustrating the operation of the semiconductor memory device illustrated in FIG. 11.

In FIG. 11, a latch circuit 14 latches page data output from the sense amplifier group 24. The latch circuit 14 performs the latch operation in accordance with an output (a φLATCH signal) of an address change detector 19 for detecting the change of address signals. The output of the latch circuit 14 is transmitted to the selector 33. An output buffer 17 outputs the selection signal of the selector 33 to an output terminal 18, which corresponds to the output circuit 20 shown in FIG. 8. The other components are identical to those in the mask ROM shown in FIGS. 8 to 10.

In such a semiconductor memory device, when the address signals A3 to A19 which specify the address a are input, a plurality of memory cells corresponding to the address a are selected from the memory cell array 10. The respective information of the memory cells is output from the sense amplifier group 24 as page data.

When the address signals A3 to A19 are changed so as to specify an address b instead of the address a, the address change detector 19 detects the change. Thus, the output φLATCH signal thereof is made active (i.e., "Low") for a short time period. Accordingly, the latch circuit 14 latches the data corresponding to the address a which is specified in the previous access cycle, and outputs the page data to the selector 33. The data selected from the page data at the address a in accordance with the address signals A0 to A2 of the page-mode address is externally output through the output buffer 17.

In general, a semiconductor memory device such as a mask ROM which is generally often used adopts a method in which, when an address (the address a) is input, the data corresponding to the address is output after a time period determined by the access time, and the input of the next address (the address b) is not necessarily required for outputting the data.

However, in the semiconductor memory device having a page mode described in the above-identified publication (Japanese Laid-Open Patent Publication No. 5-144255), it is necessary to input the next address b for reading the data corresponding to the address a. Accordingly, the data at the previous address a cannot be obtained until the next address b is input, so that there exists a time lag, thereby making it difficult to perform the random access operation quickly. Moreover, in the case where the page data corresponding to the last address is to be read, it is necessary to use a dummy cycle in the address signals.

For these reasons, the semiconductor memory device described in the above-identified publication is subjected to serious limitations in practical use, as compared with the general semiconductor memory device.

SUMMARY OF THE INVENTION

The semiconductor memory device of this invention, includes: a memory cell array having a plurality of memory cells;

row selection means for selecting a row of the memory cell array corresponding to a row address of an input address;

column selection means for selecting a plurality of columns of the memory cell array corresponding to a column address of the input address, and also selecting a plurality of columns of the memory cell array corresponding to at least one column address other than the column address of the input address;

a sense amplifier for sensing data stored in the memory cells, the sense amplifier including at least two sense amplifier groups, the sense amplifier groups sensing data read from the plurality of memory cells corresponding to the input address, and data read from the plurality of memory cells corresponding to the row address of the input address and the at least one other column address, and wherein the device has a page mode for rapidly switching and outputting data from the plurality of memory cells which have been read in parallel to the sense amplifier in accordance with the input address.

In one embodiment the at least one column address other than the column address of the input address includes a column address successive to the column address of the input address.

In another embodiment the sense amplifier includes two sense amplifier groups.

In still another embodiment when the column address of the input address is changed to the column address other than the column address of the input address, the column selection means selects a plurality of columns of the memory cell array corresponding to a new column address, and one of the two sense amplifier groups senses data read from a plurality of memory cells corresponding to the new column address and the row of the memory cell array selected by the row selection means.

In still another embodiment the semiconductor memory device further comprising a selector for receiving data output from the at least two sense amplifier groups, selecting the data from one of the at least two sense amplifier groups, and outputting the selected data.

Alternatively, the semiconductor memory device comprising: a memory cell array having a plurality of memory cells, the memory cell array being divided into at least two portions along a row direction;

row selection means for selecting rows of the at least two portions of the memory cell array, the selected rows corresponding to a row address of an input address;

column selection means for selecting a plurality of columns of the memory cell array corresponding to a column address of the input address, selecting a plurality of columns of the memory cell array corresponding to at least one column address other than the column address of the input address;

the row selection means selecting, a row corresponding to a row address successive to the row address of the input address when the column address of the input address is a predetermined culumn address;

a sense amplifier for sensing data stored in the memory cells, the sense amplifier including at least two sense amplifier groups, the sense amplifier groups sensing data read from the plurality of memory cells corresponding to the input address, and data read from a plurality of memory cells corresponding to the row address of the input address, and the at least one other column address, and wherein the device has a page mode for rapidly switching and outputting data from the plurality of memory cells which have been read in parallel to the sense amplifier in accordance with the input address.

In one embodiment the at least one column address other than the column address of the input address includes a column address successive to the column address of the input address.

In another embodiment the sense amplifier includes two sense amplifier groups.

In still another embodiment when the column address of the input address is changed to the column address other than the column address of the input address, the column selection means selects a plurality of columns of the memory cell array corresponding to a new column address, and one of the two sense amplifier groups senses data read from a plurality of memory cells corresponding to the new column address and the row of the memory cell array selected by the row selection means.

In still another embodiment the semiconductor memory device further comprising a selector for receiving data output from the at least two sense amplifier groups, selecting the data from one of the at least two sense amplifier groups, and outputting the selected data.

In still another embodiment the predetermined column address is the last address of the column addresses.

Thus, the invention described herein makes possible the advantage of: (1) providing a semiconductor memory device in which a page mode operation for successively reading respective page data is continuously performed without causing a time lag when a page change is performed, whereby continuous high-speed read can be realized in the page mode operation; (2) providing a semiconductor memory device in which a page mode operation for successively reading respective page data is continuously performed without causing a time lag even when page data at the last of the column addresses is changed to the page data at the first of the column addresses for the next row address, whereby continuous high-speed read can be realized in the page mode operation.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

(EXAMPLE 1)

Figure 1:
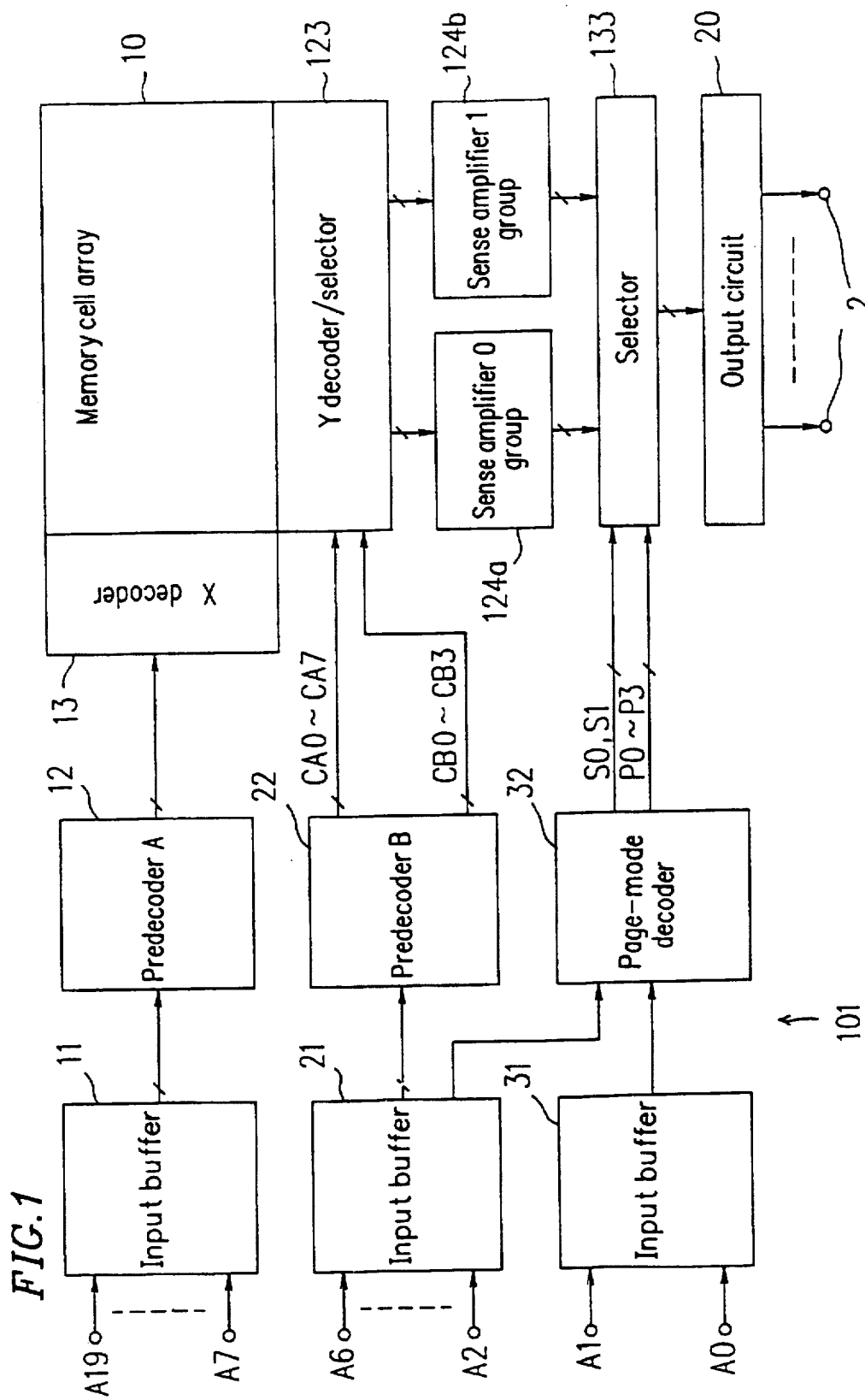
FIG. 1 is a block diagram showing a configuration of a semiconductor memory device in a first example of the invention.
Figure 2:
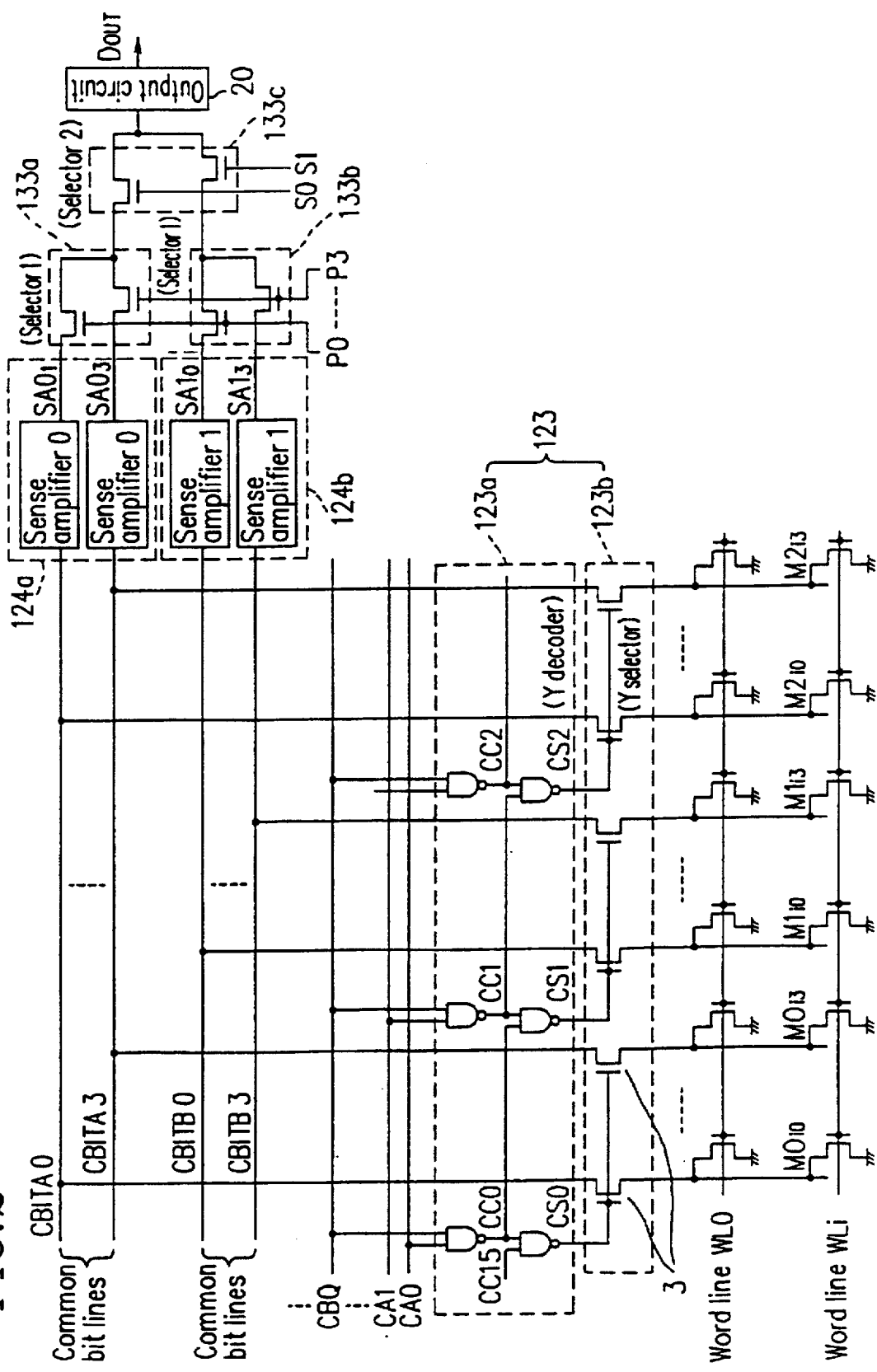
FIG. 2 is a circuit diagram showing a detailed configuration of a Y decoder/selector, a sense amplifier group, and a selector constituting the semiconductor memory device of the first example.
Figure 3:
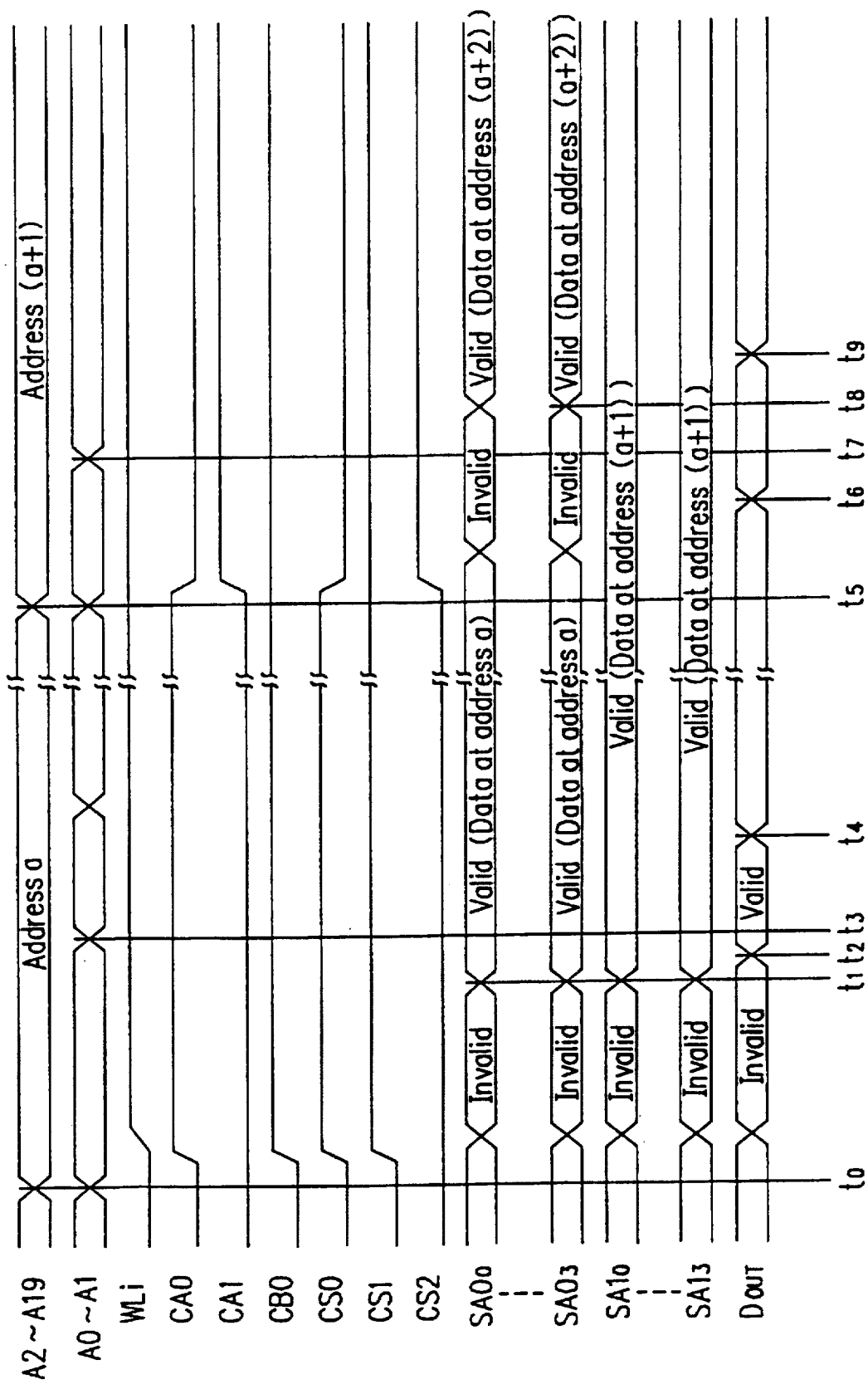
FIG. 3 is a timing chart for illustrating a high-speed read operation in a page mode in the semiconductor memory device of the first example.

FIGS. 1 to 3 are diagrams for illustrating a semiconductor memory device in a first example according to the invention. FIG. 1 is a block diagram showing a configuration of a mask read-only memory (ROM) having a page mode. FIG. 2 is a diagram showing a detailed circuit configuration of the mask ROM. FIG. 3 is a timing chart for illustrating an exemplary read operation.

In FIG. 1, the reference numeral 101 designates a semiconductor memory device (a mask ROM) having a page mode of this example. The semiconductor memory device 101 includes a Y decoder/selector 123. The Y decoder/selector 123 includes a Y selector 123b, and a Y decoder 123a. The Y selector 123b selects individual columns of a memory cell array 10. The Y decoder 123a allows the Y selector 123b to select a plurality of columns corresponding to an address specified by column address signals A2 to A6 of the input address, and to select a plurality of columns corresponding to the next address specified by the column address signals A2 to A6.

The semiconductor memory device 101 further includes a sense amplifier 0 group 124a having four sense amplifiers 0, and a sense amplifier 1 group 124b having four sense amplifiers 1. Page data read from a plurality of memory cells at the address specified by the address signals A2 to A19 of the input address, and page data read from a plurality of memory cells at the next address are sensed by the respective sense amplifier groups 124a and 124b.

In the semiconductor memory device 101, an input buffer 21 receives address signals A2 to A6 among address signals A0 to A19 as a column address. A predecoder B 22 outputs predecode outputs CA0 to CA7 and CB0 to CB3 to the Y decoder/selector 123. An input buffer 31 receives address signals A0 and A1 among the address signals A0 to A19 as a page-mode address. A page-mode decoder 32 receives the output of the input buffer 31 and part of the output of the input buffer 21. The page-mode decoder 32 outputs sense amplifier selection signals P0 to P3, and a sense amplifier group selection signals S0 and S1 to the selector 133.

The selector 133 includes first selectors (selectors 1) 133a and 133b for selecting sense amplifiers in corresponding groups in accordance with the sense amplifier selection signals P0 to P3. The first selectors 133a and 133b are respectively provided for the sense amplifier groups 124a and 124b. The selector 133 further includes a second selector (selector 2) 133c for selecting one of the outputs of the first selectors 133a and 133b in accordance with the sense amplifier group selection signals S0 and S1.

Next, the operation of the semiconductor memory device 101 is described.

As shown in FIG. 3, at time t0, the input of the address signals A0 to A19 is made valid. In this case, the semiconductor memory device 101 is set in the normal random access mode.

First, the row address signals A7 to A19 are decoded by an input buffer 11, a predecoder A 12, and an X decoder 13, so that any one of word lines WLi is made active (i.e., set in the "High" level).

Based on the column address signals A2 to A6, one of the output signals CA0 to CA7 of the predecoder B 22 and one of the output signals CB0 to CB3 thereof are made active (i.e., "High"). For example, when the address signals A2 to A19 specify the address a, the predecode outputs CA0 and CB0 are made active (i.e., "High"), and hence the NAND output CC0 becomes active (i.e., "Low"). Accordingly, the output signal CS0 of the Y decoder 123a becomes active (i.e., "High"), and also the signal CS1 corresponding to the next column address becomes active (i.e., "High"). As a result, a column selection MOS transistor 3 having an input for receiving the Y decode signals CS0 and CS1 is turned "ON."

In this way, memory cells $M0_{i0}, \ldots, M0_{i3}$, and memory cells $M1_{i0}, \ldots, M1_{i3}$ are selected. The respective information of the selected memory cells is transmitted to the common bit lines CBITA0 to CBITA3, and CBITB0 to CBITB3 via the column selection MOS transistors 3 of the Y selector 123b, and input into the sense amplifier 0 groups 124a and the sense amplifier 1 group 124b. At time t1, the outputs $SA0_0$ to $SA0_3$ of the sense amplifier 0 group 124a are made valid, so that the read of data of the page corresponding to the address a specified by the address signals A2 to A19 is completed. At this time, the outputs $SA1_0$ to $SA1_3$ of the sense amplifier 1 group 124b as the page data at an address (a+1) corresponding to the next page are also made valid.

In accordance with the page address signals A0 and A1, only one of the output signals P0 to P3 of the page-mode decoder 32 is made active (i.e., "High"). As a result, one of the outputs $SA0_0$ to $SA0_3$ of the sense amplifier 0 group 124a is output to an output terminal 2 through an output circuit 20 at time t2.

Thereafter, at time t3, the page address signals A0 and A1 are changed, and the data of the outputs $SA0_0$ to $SA0_3$ of the sense amplifier 0 group 124a is sequentially selected and output to the output terminal 2 through the output circuit 20. The response to the change of the address signals A0 and A1 at time t3 appears at the output terminal 2 at time t4. That is, the semiconductor memory device 101 is set to the page mode in which the high-speed read can be performed from the normal random access mode during a time period (t4—t3).

When the address signals A2 to A19 are changed so as to specify the address (a+1) corresponding to the next page at time t5, the predecode output CA0 is made into an inactive state (i.e., "Low") from the active state (i.e., "High"), and the predecode output CA1 is made into an active state (i.e., "High") from the inactive state (i.e., "Low"). The predecode output CB0 keeps the active state (i.e., "High"). Accordingly, the NAND output CC0 becomes inactive (i.e., "High"), and the NAND output CC1 becomes active (i.e., "low"). As a result, the Y decode output CS0 becomes inactive (i.e., "Low"), the Y decode output CS1 remains in the active state (i.e., "High"), and the Y decode output CS2 becomes active (i.e., "High").

Accordingly, the outputs $SA1_0$ to $SA1_3$ of the sense amplifier 1 group 124b hold the page data at the address (a+1), so that it is possible to perform the high-speed read by the page address signals A0 and A1 even in the first access after the change of the page. In this manner, one of the outputs $SA1_0$ to $SA1_3$ of the sense amplifier 1 group 124b is output to the output terminal 2 through the output circuit 20 at time t6.

Since the Y decode output CS2 becomes active (i.e., "High"), the memory cells $M2_{i0}, \ldots, M2_{i3}$ are selected. The respective information of the selected memory cells is transmitted to the common bit lines CBITA0 to CBITA3 via column selection MOS transistors of the Y selector 123b, and input into the sense amplifier 0 group 124a. At time t8, the outputs $SA0_0$ to $SA0_3$ of the sense amplifier 0 group 124a as the page data at the address (a+2) corresponding to the next page are made valid. In this way, the addresses are sequentially specified by the address signals A2 to A19, and the page data at the specified address are rapidly read.

As described above, in Example 1, the selection of memory cells at an address corresponding to the row address signals A7 to A19 of the input address and the selection of memory cells at the next address are simultaneously performed by the Y decoder/selector 123. The page data for two pages are read and fed to the respective sense amplifier groups 124a and 124b. Thus, immediately after the read of the page data at the address specified by the input address, the read of the page data at the next page can be performed. Accordingly, even in the case where the pages are changed and the page data is successively read, the high-speed read operation is not interrupted. That is, continuous high-speed read can be realized.

In Example 1, the Y decoder/selector 123 selects the memory cells at the address corresponding to the row address signals A7 to A19 of the input address, as well as the memory cells at the next address. Therefore, the Y decoder 123a can be realized in a simple configuration in which one NAND circuit is added to the NAND circuit which is conventionally provided for each column. This means that continuous high-speed read of page data can be realized without causing an increase in chip area.

However, in Example 1, if the input address specifies the last one of the column addresses, the next page data corresponds to the next row (word line), but the access to the page data is performed in the normal random access mode when the page is changed. This means that the page mode in which high-speed read can be performed is interrupted.

(EXAMPLE 2)

Example 2 of the invention, which is designed to solve this inefficiency of Example 1, will be described below.

Figure 4:
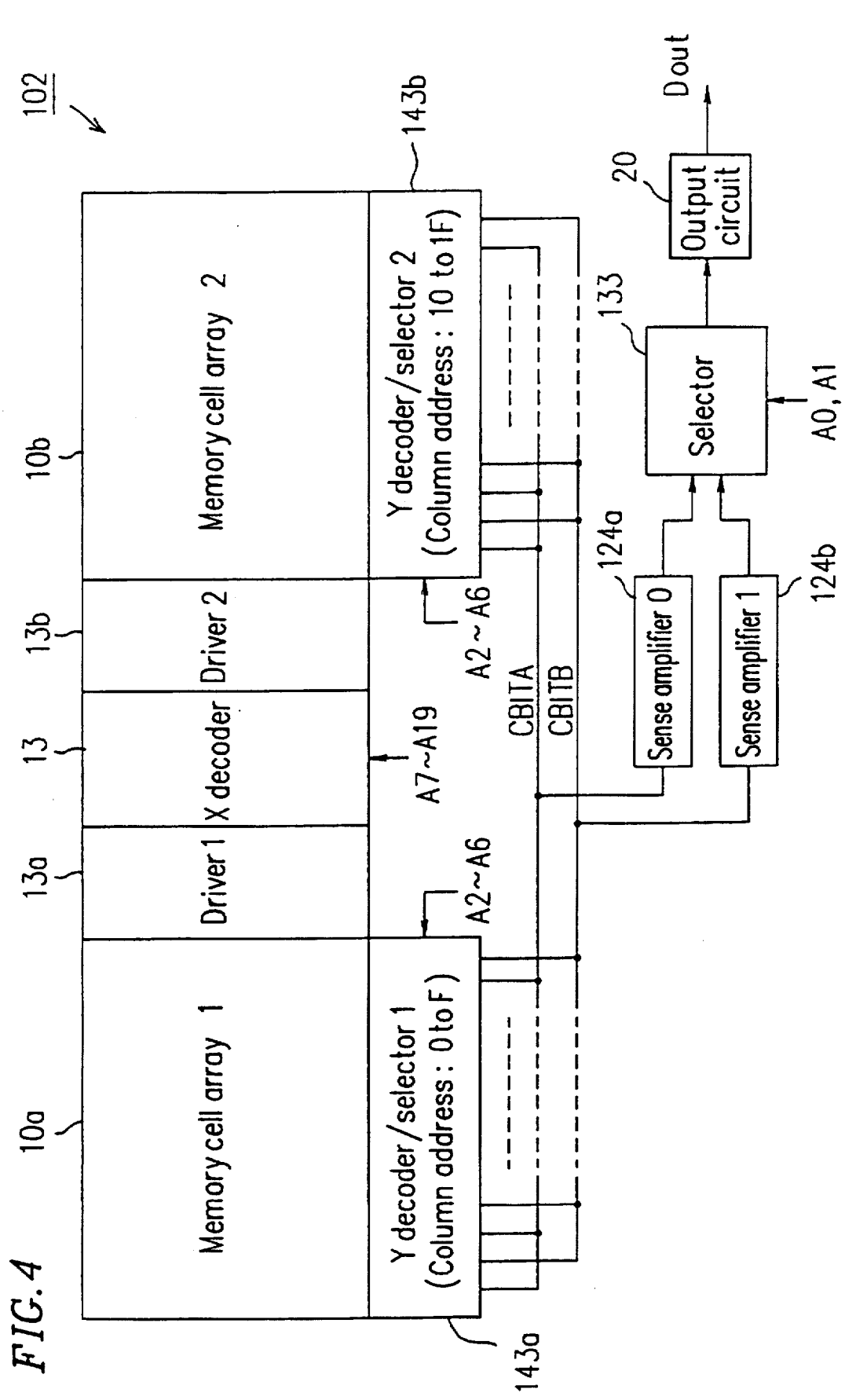
FIG. 4 is a block diagram showing a configuration of a semiconductor memory device in a second example of the invention.
Figure 5:
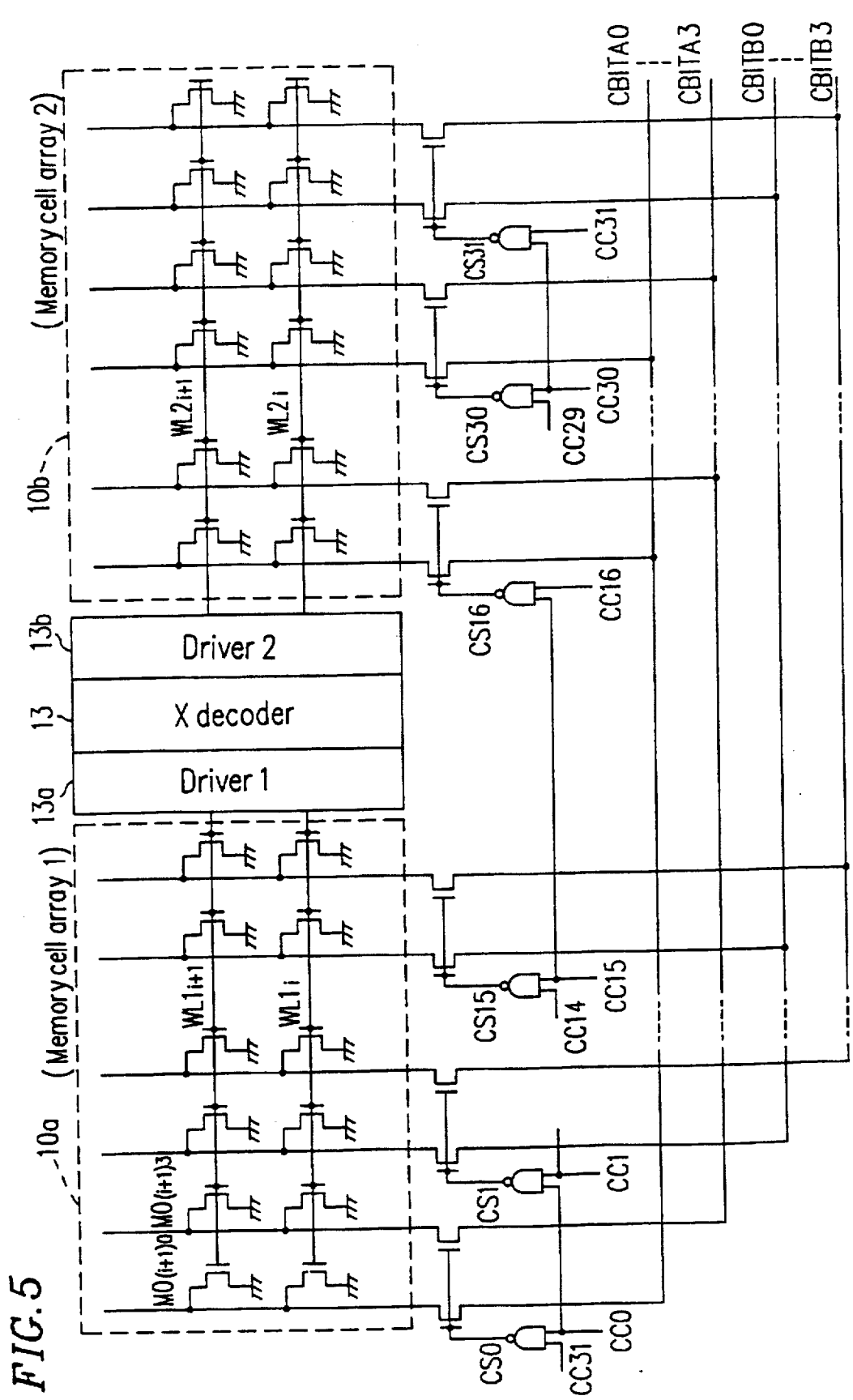
FIG. 5 is a circuit diagram showing a detailed configuration of a memory array, and a Y decoder/selector constituting the semiconductor memory device of the second example.
Figure 6:
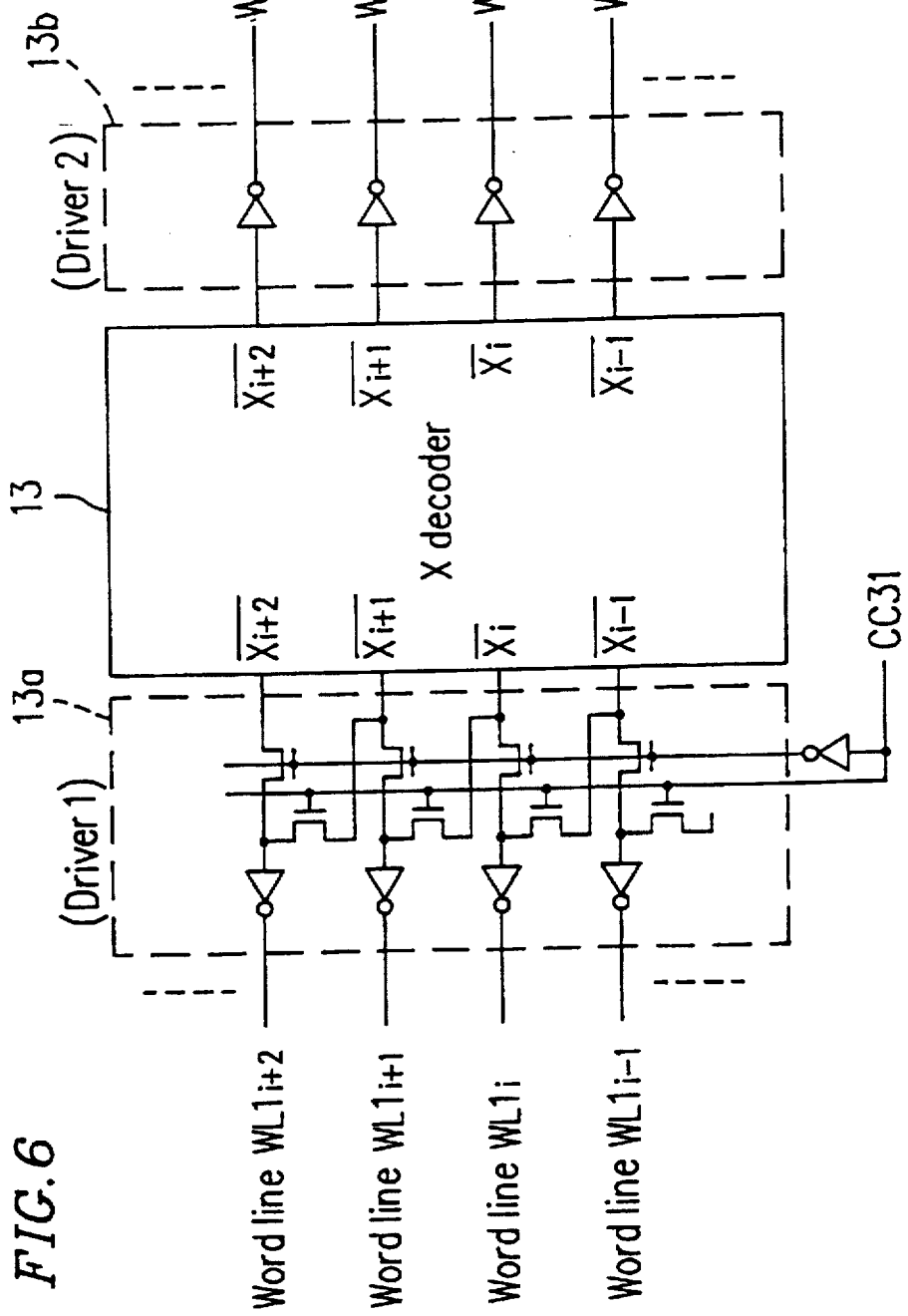
FIG. 6 is a circuit diagram showing a specific configuration of a word-line driver constituting the semiconductor memory device of the second example.
Figure 7:
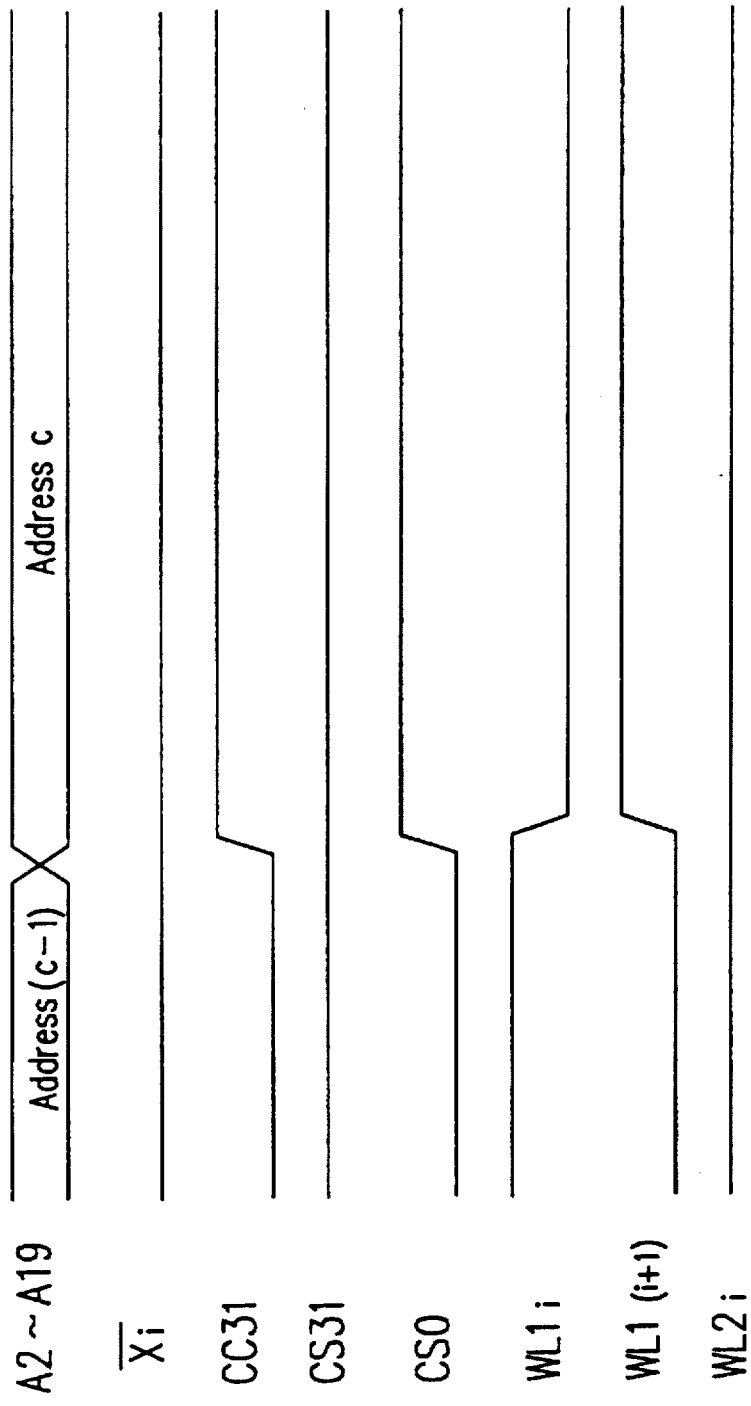
FIG. 7 is a timing chart for illustrating a high-speed read operation in a page mode in the semiconductor memory device of the second example.
Figure 8:
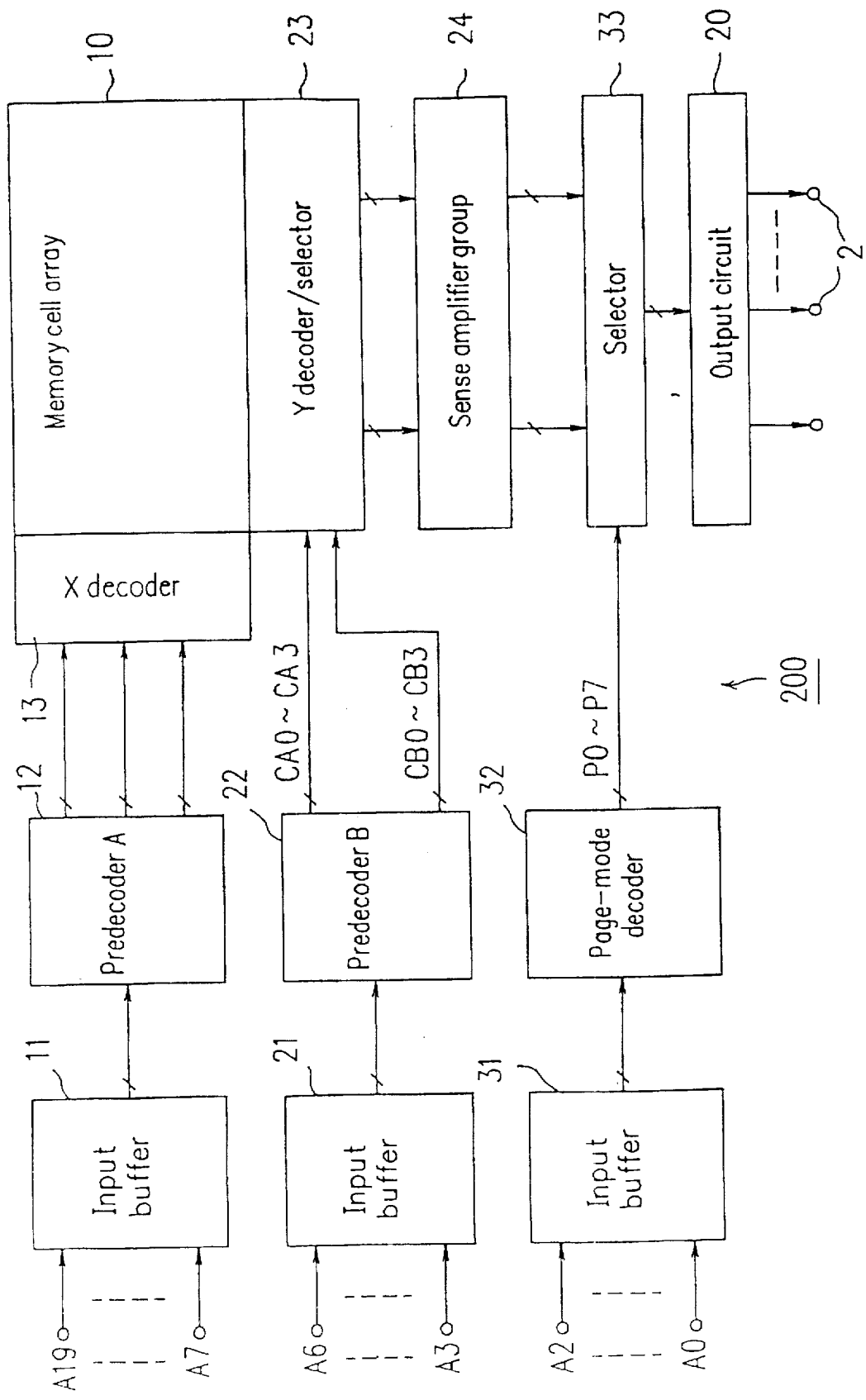
FIG. 8 is a block diagram showing a configuration of a conventional semiconductor memory device having a page mode.
Figure 9:
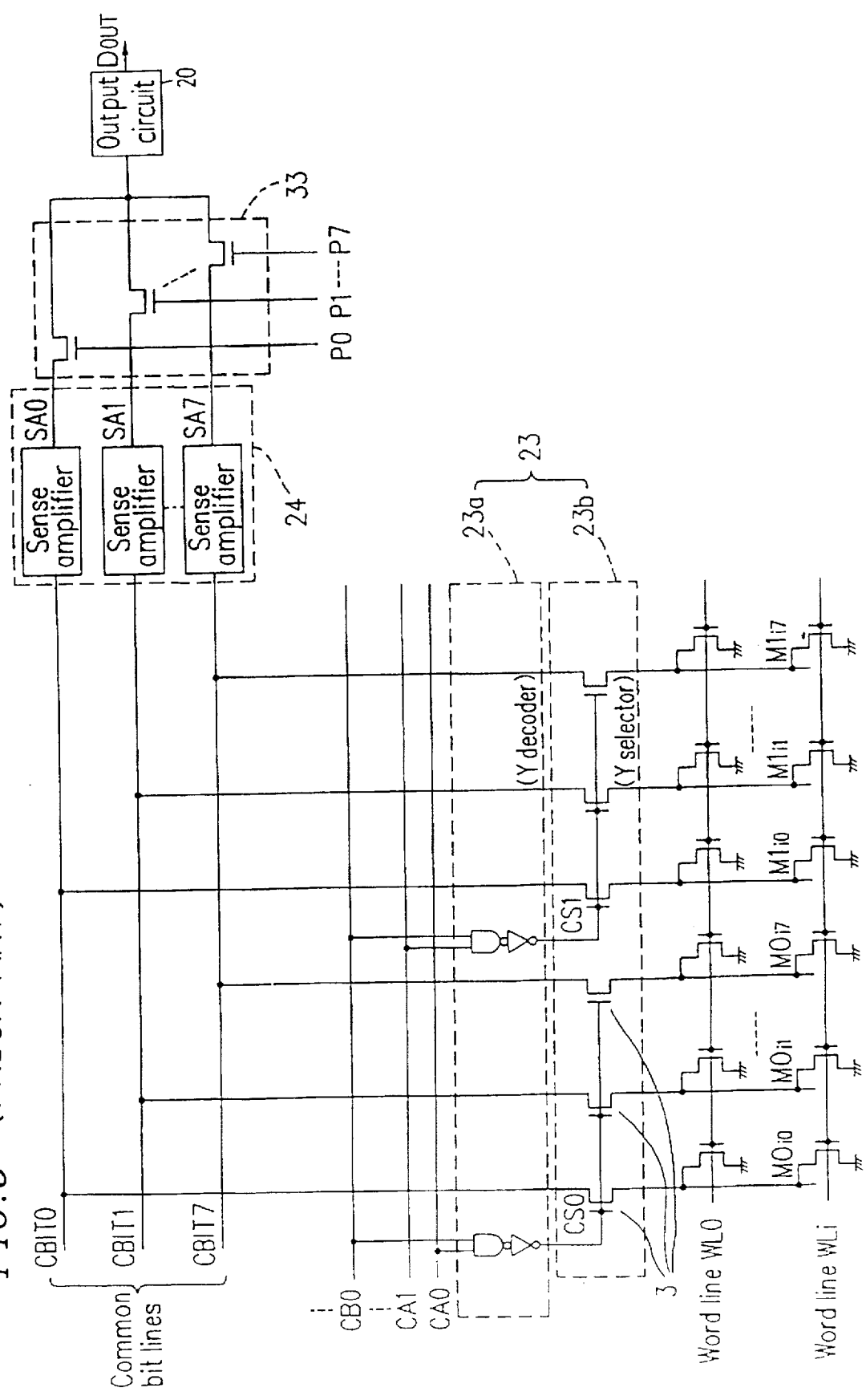
FIG. 9 is a circuit diagram showing a detailed configuration of a Y decoder/selector, a sense amplifier group, and a selector constituting the conventional semiconductor memory device.
Figure 10:
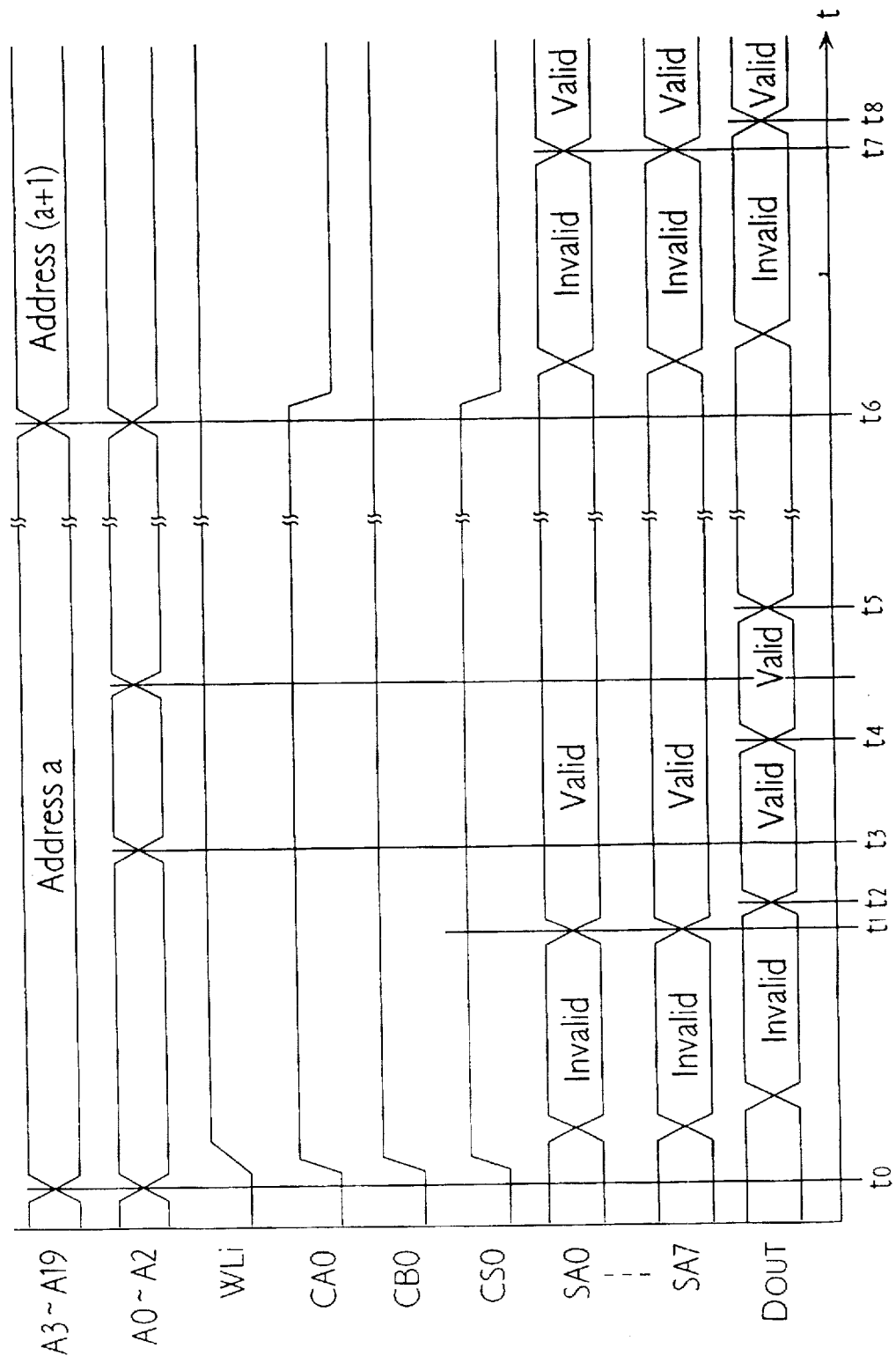
FIG. 10 is a timing chart for illustrating a high-speed read operation in a page mode in the conventional semiconductor memory device.
Figure 11:
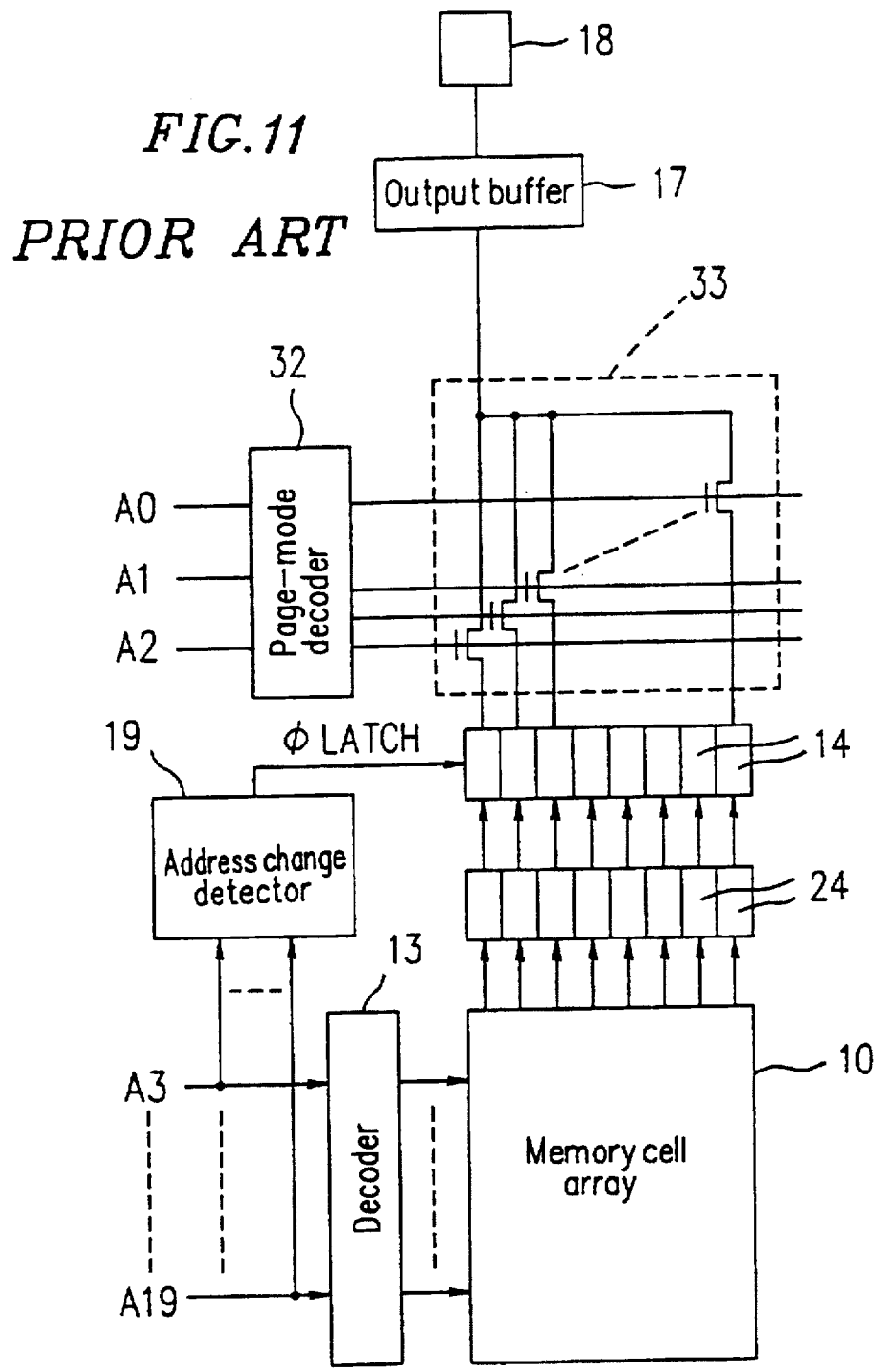
FIG. 11 is a block diagram showing part of a semiconductor memory device having a page mode described in Japanese Laid-Open Patent Publication No. 5-144255.
Figure 12:
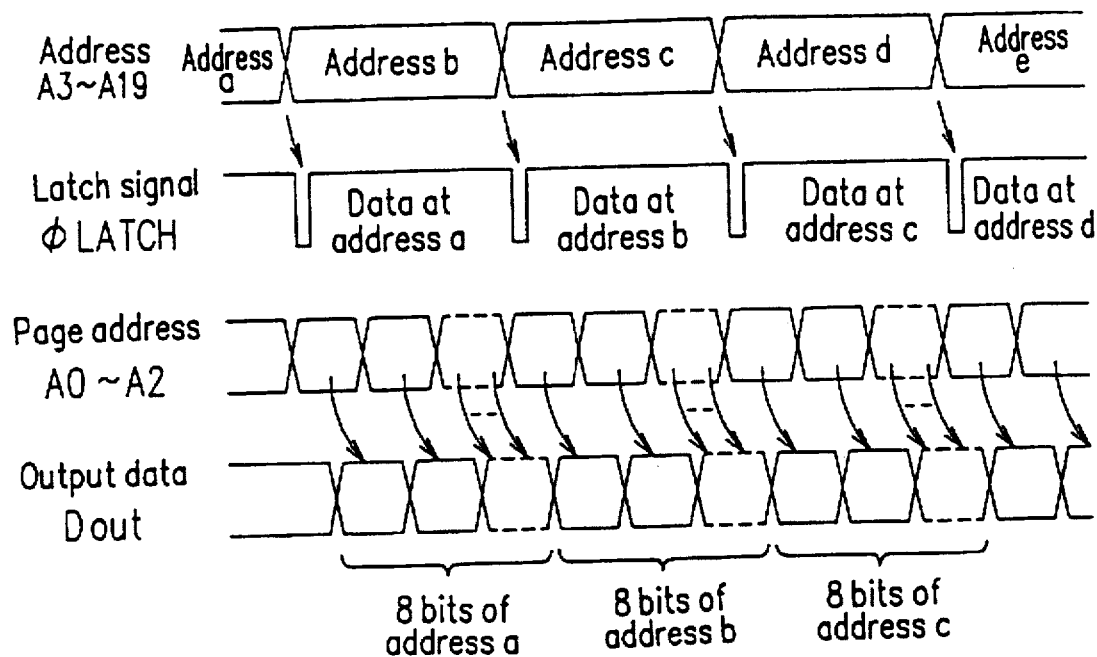
FIG. 12 is a timing chart for illustrating the operation of the semiconductor memory device described in the above-identified publication.

FIGS. 4 to 7 are diagrams for illustrating a mask read-only memory (ROM) having a page mode according to another example of the invention. FIG. 4 is a block diagram showing a configuration of the mask ROM. FIG. 5 is a diagram showing a specific circuit configuration of a memory cell array and a Y decoder/selector of the mask ROM. FIG. 6 is a diagram showing a specific circuit configuration of a driver of the mask ROM. FIG. 7 is a timing chart for illustrating an exemplary read operation.

In these figures, the same components are designated by the same reference numerals as those in FIGS. 1 to 3 of Example 1. The reference numeral 102 designates a semiconductor memory device of this example. The semiconductor memory device 102 is constructed so that the read of page data can be continuously performed even when the input address specifies the last one of the column addresses, and the next page data belongs to the next row (word line).

In the semiconductor memory device 102, the memory cell array is divided into a first memory cell array (a memory cell array 1) 10a and a second memory cell array (a memory cell array 2) 10b. A first Y decoder/selector (Y decoder/selector 1) 143a and a second Y decoder/selector (Y decoder/selector 2) 143b are provided for the memory cell arrays 10a and 10b, respectively. The outputs of the first and second Y decoder/selectors 143a and 143b are connected to the first sense amplifier group 124a via a common bit line CBITA, and also connected to the second sense amplifier group 124b via a common bit line CBITB.

Addresses 0 to F of the column address signals A2 to A6 are assigned to the first memory cell array 10a, and addresses 10 to 1F of the column address signals A2 to A6 are assigned to the second memory cell array 10b.

A first driver (driver 1) 13a and a second driver (driver 2) 13b for driving word lines are provided for the memory cell arrays 10a and 10b. The second driver 13b includes one inverter for each word line in order to invert the outputs of the X decoder 13. The first driver 13a includes one inverter and two transistors for each word line. Accordingly, the outputs of the X decoder 13 can be connected to the corresponding word lines while the outputs of the X decoder 13 are switched between a corresponding word line and a word line adjacent thereto.

Next, the operation of the semiconductor memory device 102 will be described.

When the column address signals of the input address specify the addresses 0 to 1E, rows (word lines) WL1$i$ and WL2$i$ of the first and second memory cell arrays 10a and 10b corresponding to the row address signals A7 to A19 of the input address are selected by the X decoder 13 and the first and second drivers 13a and 13b. The operation in this case is the same as that described in Example 1 shown in FIG. 3.

When the column address signals A2 to A6 of the input address specify the address 1F, and the address signals A2 to A19 specify the address c, the page mode is performed as shown in FIG. 7.

When the address signals A2 to A19 specify the address c, the X decode output (/Xi) of the outputs of the X decoder 13 is made active (i.e., "Low") in accordance with the row address signals A7 to A19 of the input address. Accordingly, in the second memory cell array 10b, the row (word line) WL2$i$ is in the selection state, i.e., at a "High" level.

In the first memory cell array 10a, the X decode output (/Xi) is active (i.e., at a "Low" level), and the output signal CC31 of the Y decoder is made active (i.e., "High"), so that the state of the row (word line) WL1$i$ is changed from the active state (i.e., "High") to the inactive state (i.e., "Low"), and the state of the next row (word line) WL1($i$+1) is changed from the inactive state (i.e., "Low") to the active state (i.e., "High"). Thus, the next row (word line) WL1($i$+1) is selected, and the Y decode output CS0 for selecting the address c of the column address becomes active (i.e., "High").

As a result, the data of the memory cells $M0_{(i+1)0}, \ldots, M0_{(i+1)3}$, the next page data, can be read from the first memory cell array 10a in parallel.

As described above, in Example 2, in addition to the configuration for reading the page data for two pages to the sense amplifier section in parallel described in Example 1, the memory cell array is divided into two array portions. However, in the case where the column address of the input address is a specific column address, a row corresponding to a row address which is next to the row address of the input address is selected in the divided array portion which is not selected by the column address. Accordingly, even when the input address specifies the last one of the column addresses, not only the page data at the last address but also the page data at the first column address for the next row address can be read to the sense amplifier section. As a result, when the page data at the last one of the column addresses is changed to the page data at the first one of the column addresses for the next row address, the read of the page data can be continuously performed.

In the above-description of the examples of the invention, a plurality of columns of the memory cell array corresponding to the column address of the input address and a plurality of columns of the memory cell array corresponding to a column address other than the column address are selected, so that the page data for two pages are read in parallel to the sense amplifier section. However, the number of columns which are selected at the same time as the column address of the input address is not limited to one, but can be two or more. In an example case, page data for three or more pages can be read in parallel to the sense amplifier section.

As described above, according to the semiconductor memory device of the present invention, the column selection section is constructed so that a plurality of columns of the memory cell array corresponding to the column address of the input address are selected as well as a plurality of columns of the memory cell array corresponding to at least one column address other than the column address of the input address. Accordingly, page data for at least two pages including the page data corresponding to the column address of the input address can be read in parallel to the sense amplifier section.

Therefore, when the read of the page data at the address specified by the input address is completed, and the read operation proceeds to the read of the page data at the next address, it is possible to read the page data at the next address to the sense amplifier section prior to the read operation commencing on the next address. As a result, even when the change of pages is performed in the continuous read of page data, the high-speed read operation is not interrupted, and the continuous high-speed read can be realized.

It is sufficient for the column selection section to select a plurality of columns corresponding to the column address of the input address as well as a plurality of columns corresponding to at least one address other than the column address of the input address. For example, the column selection section can be realized by a simple circuit configuration in which one logic circuit is added for each group of a plurality of columns specified by the column address in a conventional column selection circuit.

As a result, the page-mode operation for continuously reading the data for respective pages can be continuously performed without causing any time lag in the change of pages. Moreover, the continuous high-speed read in such a page-mode operation can be realized by a simple circuit configuration without causing an increase in a chip area.

According to the semiconductor memory device of the present invention, in addition to the above-described configuration in which page data for at least two pages are read in parallel to the sense amplifier section, the memory cell array is divided into array portions. Only in the case where the column address of the input address is a specific column address, a row corresponding to a row address which is next to the row address of the input address is selected in the divided array portion which is not selected by the column address. Accordingly, even when the input address specifies the last one of the column addresses, not only the page data at the last address but also the page data at the first column address for the next row address can be read to the sense amplifier section. As a result, when the page data at the last one of the column addresses is changed to the page data at the first one of the column addresses for the next row address, the read of the page data can be continuously performed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:

a memory cell array having a plurality of memory cells, the memory cell array being divided into at least two portions along a row direction;

row selector for selecting rows of the at least two portions of the memory cell array, the selected rows corresponding to a row address of an input address;

column selector for selecting a column of the memory cell array corresponding to a first column address of the input address, and selecting a column of the memory cell array corresponding to a second column address different from the first column address of the input address;

a sense amplifier for sensing data stored in the memory cells, the sense amplifier including first and second sense amplifier groups;

wherein the row selector selects a row corresponding to a row address successive to the row address of the input address when the first column address of the input address is a predetermined column address.

the first sense amplifier group senses data read from a first plurality of memory cells corresponding to the row address of the input address and the first column address of the input address.

the second sense amplifier group senses data read from a second plurality of memory cells corresponding to the row address of the input address and the second column address, and the device has a page mode for rapidly switching and outputting data from the plurality of memory cells which have been read in parallel to the sense amplifier in accordance with the input address.

2. A semiconductor memory device according to claim 1 wherein the second column address is successive to the first column address of the input address.

3. A semiconductor memory device according to claim 1, wherein the sense amplifier includes a plurality of sense amplifier groups.

4. A semiconductor memory device according to claim 3, wherein when the first column address of the input address is changed to the second column address, the column selector selects a plurality of columns of the memory cell array corresponding to a third column address different from the first and second column addresses, and one of the first and second sense amplifier groups senses data read from a third plurality of memory cells corresponding to the third column address and the row of the memory cell array selected by the row selector.

5. A semiconductor memory device according to claim 1 further comprising a selector for receiving data output from the first and second sense amplifier groups, selecting the data from one of the first and second sense amplifier groups, and outputting the selected data.

6. A semiconductor memory device according to claim 1, wherein the predetermined column address is a last address of the column addresses.

* * * * *